United States Patent
Yamaji

(10) Patent No.: US 9,468,071 B2
(45) Date of Patent: Oct. 11, 2016

(54) SWITCHING POWER SUPPLY DEVICE AND PROJECTION VIDEO DISPLAY DEVICE

(71) Applicant: Panasonic Intellectual Property Management Co., Ltd., Osaka-shi, Osaka (JP)

(72) Inventor: Tsuyoshi Yamaji, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/850,549

(22) Filed: Sep. 10, 2015

(65) Prior Publication Data

US 2016/0079865 A1   Mar. 17, 2016

(30) Foreign Application Priority Data

Sep. 11, 2014  (JP) ................................. 2014-184962
Jul. 30, 2015  (JP) ................................. 2015-150191

(51) Int. Cl.

| | |
|---|---|
| H05B 33/08 | (2006.01) |
| H04N 9/31 | (2006.01) |
| H02M 1/32 | (2007.01) |
| H02M 3/337 | (2006.01) |
| H02M 3/335 | (2006.01) |
| H02M 1/00 | (2006.01) |

(52) U.S. Cl.

CPC .............. *H05B 33/089* (2013.01); *H02M 1/32* (2013.01); *H02M 3/337* (2013.01); *H04N 9/3155* (2013.01); *H05B 33/083* (2013.01); *H05B 33/0815* (2013.01); *H02M 3/33576* (2013.01); *H02M 2001/0009* (2013.01); *H02M 2001/0058* (2013.01)

(58) Field of Classification Search
None
See application file for complete search history.

(56) References Cited

U.S. PATENT DOCUMENTS

| | | | |
|---|---|---|---|
| 2012/0025720 A1* | 2/2012 | Chen ..................... | H02M 3/337 315/185 R |
| 2012/0146530 A1* | 6/2012 | Han ................... | H05B 33/0815 315/219 |
| 2014/0368167 A1* | 12/2014 | Okura ..................... | H02J 5/005 320/109 |
| 2014/0376276 A1 | 12/2014 | Yamadaya | |
| 2015/0002044 A1* | 1/2015 | Han ................... | H05B 33/0815 315/223 |

FOREIGN PATENT DOCUMENTS

| | | |
|---|---|---|
| JP | 4-353897 | 12/1992 |
| JP | 2014-064353 | 4/2014 |

* cited by examiner

*Primary Examiner* — Dedei K Hammond
(74) *Attorney, Agent, or Firm* — Hamre, Schumann, Mueller & Larson, P.C.

(57) ABSTRACT

A switching power supply device includes a transformer which includes a secondary winding divided into a plurality of winding units, a resonant capacitor, and a first switching element and a second switching element. Further, the switching power supply device includes a plurality of rectifier diodes which extracts voltages induced to the secondary winding in the winding units, an output voltage switching circuit which switches the voltages extracted from the plurality of rectifier diodes and outputs a switched voltage, a current detection circuit which detects a current flowing in a load circuit, and a controller which controls the output voltage switching circuit based on a detection result of the current detection circuit.

3 Claims, 7 Drawing Sheets

SWITCHING POWER SUPPLY DEVICE AND PROJECTION VIDEO DISPLAY DEVICE

BACKGROUND

1. Field of the Disclosure

The present disclosure relates to a switching power supply device and a projection video display device which has the switching power device.

2. Background Art

Unexamined Japanese Patent Publication No. 2014-64353 (Patent Literature 1) discloses a current resonant switching power supply device typically such as a converter device of LLC type.

SUMMARY

The present disclosure provides a switching power supply device of LLC type which, even when a significant load fluctuation occurs in a circuit which receives a supply of power (such information will be also referred to as a "load circuit" below), can control a voltage to a predetermined output voltage and stably supply power, and a projection video display device which has the switching power supply device.

The switching power supply device according to the present disclosure includes: a transformer which includes a primary winding and a secondary winding divided into a plurality of winding units; a resonant capacitor which forms a resonant circuit including the primary winding as a component; a first switching element and a second switching element which are provided at a side of the primary winding; a plurality of rectifier diodes which extracts voltages induced to the secondary winding in the winding units; an output voltage switching circuit which switches the voltages extracted from the plurality of rectifier diodes and outputs a switched voltage; a current detection circuit which detects a current flowing in a load circuit; and a controller which controls the output voltage switching circuit based on a detection result of the current detection circuit.

The projection video display device according to the present disclosure includes a light source, and a switching power supply device which supplies power to the light source. This switching power supply device includes a transformer which includes a primary winding and a secondary winding divided into a plurality of winding units, a resonant capacitor which forms a resonant circuit including the primary winding as a component, a first switching element and a second switching element which are provided at a side of the primary winding, a plurality of rectifier diodes which extracts voltages induced to the secondary winding in the winding units, an output voltage switching circuit which switches the voltages extracted from the plurality of rectifier diodes and outputs a switched voltage, a current detection circuit which detects a current flowing in the light source, and a controller which controls the output voltage switching circuit based on a detection result of the current detection circuit.

The switching power supply device of LLC type according to the present disclosure is effective as a power supply device which can stably supply power controlled to a predetermined output voltage, to a load circuit which is likely to cause a significant load fluctuation.

DETAILED DESCRIPTION

Figure 1:
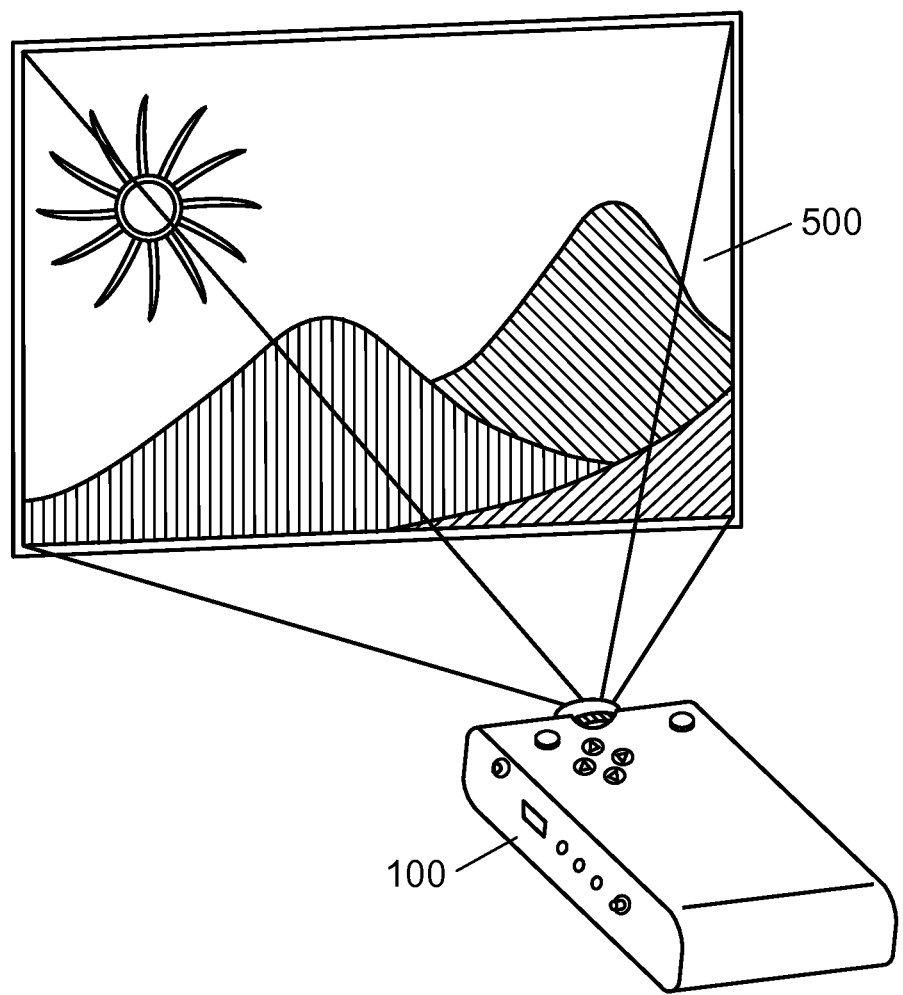
FIG. 1 is a perspective view schematically illustrating an example of an external appearance of a projection video display device which has a switching power supply device of LLC type according to a first exemplary embodiment.

Exemplary embodiments will be described in detail below optionally with reference to the drawings. In this regard, the exemplary embodiments will not be described in detail more than necessary. For example, matters which have been already well known will not be described in detail or substantially same components will not be described again in some cases. This is to prevent the following description from unnecessarily becoming redundant and help one with ordinary skill in the art understand the exemplary embodiments.

In addition, the accompanying drawings and the following description are provided to help one with ordinary skill in the art sufficiently understand the present disclosure, and do not intend to limit a subject matter recited in the claims.

In addition, same reference numerals, symbols and numbers in the description will indicate the same components unless specified in particular. Further, components which are not indispensable for the present disclosure will not be described unless described in particular.

First Exemplary Embodiment

The first exemplary embodiment will be described below with reference to FIGS. 1 to 7.

[1-1. Configuration]

FIG. 1 is a perspective view schematically illustrating an example of an external appearance of projection video display device 100 which has switching power supply device 28 of LLC type according to the first exemplary embodiment.

Projection video display device 100 projects video light generated according to a video signal input from outside, to screen 500. Projection video display device 100 is an example of a projection video display device.

Figure 2:
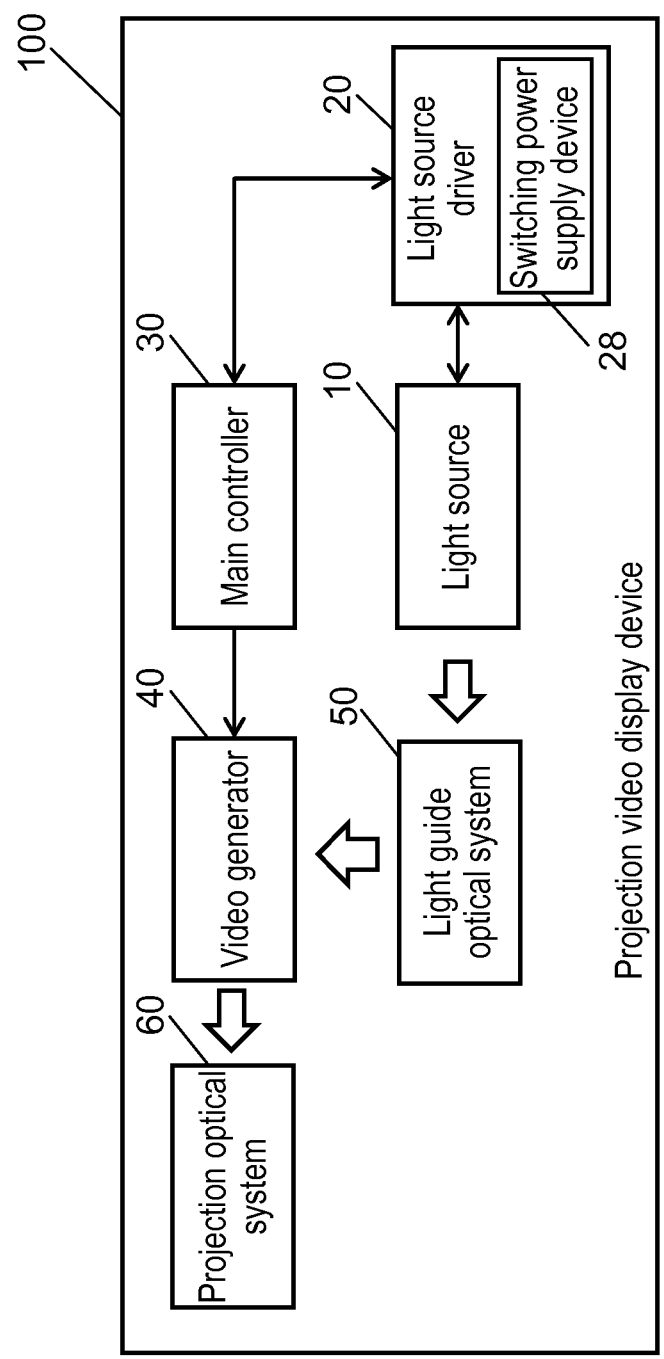
FIG. 2 is a block diagram schematically illustrating one configuration example of the projection video display device which has the switching power supply device of LLC type according to the first exemplary embodiment.

FIG. 2 is a block diagram schematically illustrating one configuration example of projection video display device 100 which has switching power supply device 28 of LLC type according to the first exemplary embodiment. In addition, FIG. 2 illustrates signal flows as solid arrows, and illustrates light flows as outlined arrows.

In addition, projection video display device 100 illustrated in FIG. 2 is an example of the projection video display device, and the projection video display device according to the present exemplary embodiment is not limited to the configuration illustrated in FIG. 2.

Projection video display device 100 includes light source 10 which is an example of a light source, light source driver 20, main controller 30 which is an example of a controller, video generator 40, light guide optical system 50 and projection optical system 60.

Light source 10 includes a plurality of semiconductor laser diodes (not illustrated in FIG. 2) which is examples of semiconductor light source elements. Light source 10 causes phosphor (not illustrated) to emit light by using laser light output from each semiconductor laser diode as excitation light. Further, light source 10 is configured to emit emission light of the phosphor and laser light as illumination light.

Light guide optical system 50 includes optical members (not illustrated) such as various lenses, mirrors and a rod integrator. Further, light guide optical system 50 is configured to guide illumination light emitted from light source 10 to video generator 40 by using these optical members.

Video generator 40 includes an element such as a digital micromirror device (DMD) or a liquid crystal panel which spatially modulates light. Further, video generator 40 is configured to spatially modulate illumination light emitted from light source 10 according to a video signal input from outside by using this element, and generate video light.

Projection optical system 60 includes optical members such as lenses and mirrors. Further, projection optical system 60 is configured to enlarge video light generated by video generator 40 by using these optical members, and project the video light to screen 500.

Main controller 30 is configured to control the entirety of projection video display device 100 including light source driver 20 and video generator 40.

Light source driver 20 includes switching power supply device 28 of LLC type (referred to simply as a "switching power supply device 28" below), and is configured to generate power required to drive light source 10 and supply power to light source 10. Switching power supply device 28 will be described below.

In addition, a configuration and an operation of each block included in projection video display device 100 are substantially the same as those of a generally used projector except for configurations of switching power supply device 28 of light source driver 20 and light source 10, and therefore will not be described in detail.

Next, the configurations of switching power supply device 28 and light source 10 according to the present exemplary embodiment will be described.

Figure 3:
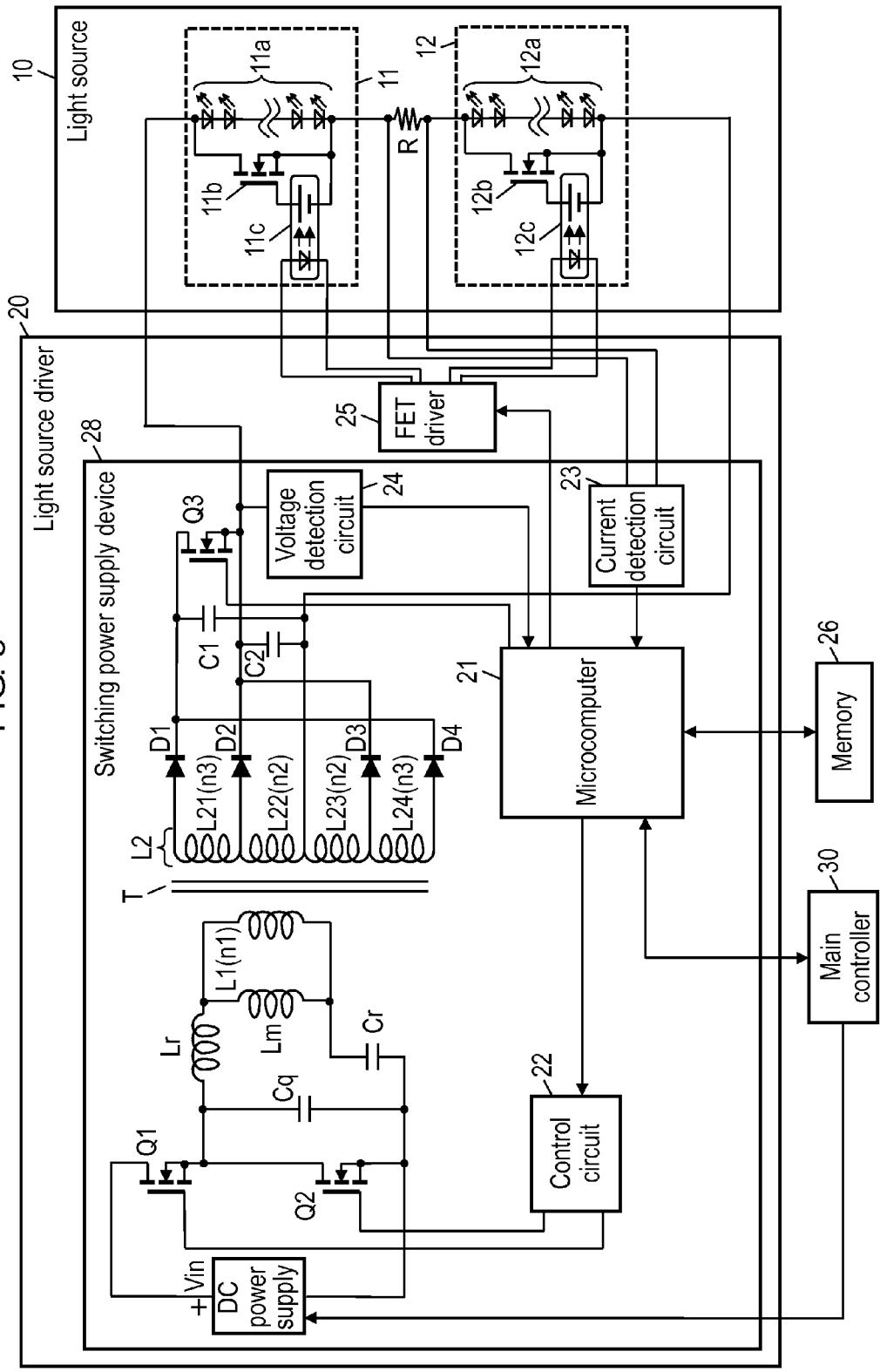
FIG. 3 is a circuit diagram illustrating one configuration example of the switching power supply device and a light source according to the first exemplary embodiment.

FIG. 3 is a circuit diagram illustrating one configuration example of switching power supply device 28 and light source 10 according to the first exemplary embodiment. FIG. 3 illustrates light source driver 20, light source 10 and main controller 30.

Light source driver 20 includes switching power supply device 28 which is an example of the switching power supply device, and FET driver 25. Switching power supply device 28 is an LLC converter device (current resonant switching power supply device). In addition, light source 10 is an example of a load circuit to which switching power supply device 28 supplies power.

Switching power supply device 28 includes DC (direct current) power supply Vin which is an example of a DC power supply device, switching element Q1 which is an example of a first switching element, switching element Q2 which is an example of a second switching element, transformer T which is an example of a transformer, capacitor Cq, capacitor Cr which is an example of a resonant capacitor, diodes D1, D2, D3 and D4 which are examples of rectifier diodes, capacitor C1 which is an example of a first capacitor, capacitor C2 which is an example of a second capacitor, switching element Q3 which is an example of an output voltage switching circuit, current detection circuit 23 which is an example of a current detection circuit, voltage detection circuit 24 which is an example of a voltage detection circuit, microcomputer 21 which is an example of a controller, and control circuit 22 which is an example of the controller.

DC power supply Vin is an example of a power supply device which can output DC power. In addition, DC power supply Vin may be installed outside switching power supply device 28 or outside light source driver 20.

Switching elements Q1 and Q2 are electrically connected in series with each other and are connected in series to both terminals of DC power supply Vin. Switching element Q1 is arranged at a plus side of DC power supply Vin, and switching element Q2 is arranged at a minus side (or a ground side) of DC power supply Vin. Control circuit 22 performs control to switch conduction and blocking (switching operation) of switching elements Q1 and Q2. A conducted state of each switching element will be referred to as "on" or a blocked state will be referred to as "off". In addition, an example where N channel FETs (Field Effect Transistor) are used for switching elements Q1 and Q2 will be described in the present exemplary embodiment. However, the present disclosure is by no means limited to this configuration.

Transformer T includes primary winding L1 and secondary winding L2. Primary winding L1 is an example of a primary winding, and secondary winding L2 is an example of secondary winding. One end of primary winding L1 is connected to an electrical connection point of switching element Q1 and switching element Q2. Further, a current output from DC power supply Vin is supplied to primary winding L1 through switching element Q1 and the connection point. In addition, in the present exemplary embodiment, a number of turns of primary winding L1 of transformer T will be referred to as "n1". Further, an example where n1 is 36 turns and a number of turns of secondary winding L2 is 24 turns will be described in the present exemplary embodiment. However, the present disclosure is by no means limited to this configuration.

Primary winding L1 of transformer T includes magnetizing inductance Lm corresponding to a coupling coefficient of transformer T and leakage inductance Lr as illustrated in FIG. 3. In addition, FIG. 3 individually illustrates primary winding L1, magnetizing inductance Lm of primary winding L1 and leakage inductance Lr. However, inductances Lr and Lm do not exist independently from primary winding L1.

The other end of primary winding L1 is connected to one end of capacitor Cr, and the other end of capacitor Cr is connected to the minus side (or the ground side) of DC power supply Vin. Thus, primary winding L1 and capacitor Cr are electrically connected in series in switching power supply device 28, so that magnetizing inductance Lm, leakage inductance Lr and capacitor Cr form a current resonant circuit. This current resonant circuit is an example of a current resonant circuit. A resonating operation of this current resonant circuit induces a voltage to secondary winding L2 of transformer T.

Capacitor Cq is a voltage resonant capacitor which reduces electric loss of switching elements Q1 and Q2, and is electrically connected in parallel to primary winding L1.

In switching power supply device 28 according to the present exemplary embodiment, secondary winding L2 of transformer T is divided into four winding units L21, L22, L23, and L24. Four winding units L21, L22, L23, and L24 are examples of a plurality of winding units. In addition, in the present exemplary embodiment, the numbers of turns of winding unit L22 and winding unit L23 are respectively referred to as "n2", and the numbers of turns of winding unit L21 and winding unit L24 are respectively referred to as "n3". Further, an example where n2 is 8 turns and n3 is 4 turns will be described in the present exemplary embodiment. However, the present disclosure is by no means limited to this configuration.

Diodes D1, D2, D3 and D4 are examples of rectifier diodes which rectify a voltage generated in secondary winding L2. An anode of diode D1 is electrically connected to one end of winding unit L21. An anode of diode D2 is electrically connected to an electric connection point of the other end of winding unit L21 and one end of winding unit L22. An anode of diode D3 is electrically connected to an electric connection point of the other end of winding unit L23 and one end of winding unit L24. An anode of diode D4 is electrically connected to the other end of winding unit L24. Further, a cathode of diode D1 and a cathode of diode D4 are electrically connected with each other, and a cathode of diode D2 and a cathode of diode D3 are electrically connected with each other. In addition, the cathodes of diodes D1 to D4 are examples of a plurality of voltage output terminals.

Capacitor C1 is an example of a capacitor which smooths a voltage. Capacitor C1 has one end which is electrically connected to an electric connection point of the cathode of diode D1 and the cathode of diode D4, and the other end which is electrically connected to an electric connection point of the other end of winding unit L22 and one end of winding unit L23.

Capacitor C2 is an example of a capacitor which smooths a voltage. Capacitor C2 has one end which is electrically connected to an electric connection point of the cathode of diode D2 and the cathode of diode D3, and the other end which is electrically connected to an electric connection point of the other end of winding unit L22 and one end of winding unit L23.

Thus, the other end of capacitor C1 and the other end of capacitor C2 are electrically connected with each other.

According to this configuration, the voltage rectified by diode D1 or diode D4 is smoothed by capacitor C1. Further, the voltage rectified by diode D2 or diode D3 is smoothed by capacitor C2.

Switching element Q3 is an example of an output voltage switching circuit which selects and switches an output voltage generated by secondary winding L2 of transformer T in winding units. In addition, an example where the N channel FET is used for switching element Q3 will be described in the present exemplary embodiment. However, the present disclosure is by no means limited to this configuration.

A drain terminal of switching element Q3 is connected to one end of capacitor C1 (the electric connection point of the cathode of diode D1 and the cathode of diode D4), and a source terminal of switching element Q3 is connected to one end of capacitor C2 (the electric connection point of the cathode of diode D2 and the cathode of diode D3). Further, the source terminal of switching element Q3 is electrically connected to light source 10 and voltage detection circuit 24, too. A gate terminal of switching element Q3 is connected to microcomputer 21, and receives a supply of a control signal output from microcomputer 21. Thus, microcomputer 21 can control switching of on and off of switching element Q3 (switching operation).

As described above, the source terminal of switching element Q3 is connected with light source 10. Hence, when switching element Q3 is in a conducted state (on state), an output voltage (referred to as a "first output voltage" below) rectified by diode D1 or diode D4 and smoothed and obtained by capacitors C1 and C2 among output voltages of secondary winding L2 is supplied to light source 10. Hence, when switching element Q3 is in a blocked state (off state), an output voltage (referred to as a "second output voltage" below) rectified by diode D2 or diode D3 and smoothed and obtained by capacitor C2 among output voltages of secondary winding L2 is supplied to light source 10.

Light source 10 includes first light source module 11, second light source module 12 and current detection resistor R.

First light source module 11 and second light source module 12 are examples of light source modules. Resistor R is an example of a current detection resistor which detects a current flowing in first light source module 11 and second light source module 12.

Resistor R is connected in series between first light source module 11 and second light source module 12. First light source module 11 and second light source module 12 are electrically connected in series sandwiching resistor R. Further, first light source module 11 is electrically connected to the source terminal of switching element Q3, and second light source module 12 is electrically connected to the electric connection point of the other end of capacitor C1 and the other end of capacitor C2.

First light source module 11 includes a plurality of semiconductor laser diodes 11a, FET 11b and FET driver 11c. FET 11b is an example of a short-circuiting switching element. In addition, an example where FET 11b is an N channel FET will be described in the present exemplary embodiment. However, the present disclosure is by no means limited to this configuration. Further, the number of semiconductor laser diodes 11a included in first light source module 11 is, for example, eight. However, the present disclosure is by no means limited to this number.

A plurality of semiconductor laser diodes 11a is electrically connected in series with each other. FET 11b is electrically arranged in parallel to a plurality of semiconductor laser diodes 11a connected in series. Further, a plurality of semiconductor laser diodes 11a connected in series includes one end portion (anode) connected with a drain terminal of FET 11b, and the other end portion (cathode) connected with a source terminal of FET 11b. Hence, when FET 11b is in the on state, both terminals (the anode at the one end portion and the cathode at the other end portion) of a plurality of semiconductor laser diodes 11a connected in series is short-circuited.

FET driver 11c has a configuration in which a LED (Light Emitting Diode) and a photocell are integrated. When the LED emits light in FET driver 11C, an electromotive force is generated by the photocell. The photocell of FET driver 11c is electrically connected between the gate terminal and the source terminal of FET 11b such that the output of the photocell is supplied to the gate terminal of FET 11b. Further, when the LED emits light, FET 11b switches to the on state (conducted state) and, when the LED does not emit light, FET 11b switches to the off state (blocked state). Thus, in first light source module 11, FET 11b is switched between on and off by controlling the switching of light emission and non-light emission of the LED of FET driver 11c.

Further, when FET 11b switches to the off state, a current does not flow to FET 11b and flows to semiconductor laser diodes 11a, so that semiconductor laser diodes 11a emit light. Furthermore, when semiconductor laser diodes 11a are broken and become an insulated states, a current flows to FET 11b by switching FET 11b to the on state. Consequently, it is possible to secure a current path in which a current flows without passing through semiconductor laser diodes 11a.

Second light source module 12 has the substantially same configuration as that of first light source module 11, and includes a plurality of semiconductor laser diodes 12a, FET 12b and FET driver 12c similar to first light source module 11. The description of second light source module 12 will be repetitive and therefore will not be described.

Current detection circuit 23 is electrically connected to both terminals of current detection resistor R, and is configured to measure a voltage between both terminals of resistor R and detect a current flowing in light source 10. Information indicating a detected current value is supplied from current detection circuit 23 to microcomputer 21.

FET driver 25 is configured to control light emission and non-light emission of the LED of FET driver 11c of first light source module 11 and the LED of FET driver 12c of second light source module 12 based on a control signal from microcomputer 21. Thus, switching between on (conduction) and off (block) of FET 11b of first light source module 11 and FET 12b of second light source module 12 is controlled by microcomputer 21.

When, for example, detecting a failure of semiconductor laser diode 12a, microcomputer 21 switches FET 12b to the on state through FET driver 25. Thus, in light source 10, a current path of currents flowing to semiconductor laser diodes 11a is secured by FET 12b which has switched to the on state. Consequently, it is possible to maintain light emission of semiconductor laser diodes 11a.

Voltage detection circuit 24 is electrically connected to the source terminal of switching element Q3, and is configured to detect a voltage of the source terminal of switching element Q3. Consequently, voltage detection circuit 24 can detect a voltage of power supplied from secondary winding L2 of transformer T to light source 10. Information indicating a detected voltage value is supplied from voltage detection circuit 24 to microcomputer 21.

Microcomputer 21 is configured to monitor the voltage detected by voltage detection circuit 24, i.e., an output voltage of secondary winding L2, and supply information indicating this detected voltage to control circuit 22.

Control circuit 22 is an oscillation circuit which is configured to alternately switch switching element Q1 and switching element Q2 to the on state. The number of times of repetition of the on state and the off state per unit time (e.g. one second) will be referred to as "switching frequency fs" below.

Control circuit 22 is configured to control switching operations of switching elements Q1 and Q2 based on voltage information supplied from microcomputer 21. In switching power supply device 28, the output voltage of secondary winding L2 is changed by changing the switching frequency fs of switching elements Q1 and Q2. Hence, control circuit 22 compares the voltage detected by voltage detection circuit 24 and a comparison value set in advance, and controls switching frequency fs of switching elements Q1 and Q2 based on this comparison result. Consequently, switching power supply device 28 can keep the output voltage of secondary winding L2 at a substantially fixed voltage.

In addition, microcomputer 21 may compare the voltage detected by voltage detection circuit 24 and a comparison value set in advance. Further, information indicating this comparison result may be supplied from microcomputer 21 to control circuit 22.

However, when a significant load fluctuation occurs in the load circuit, it is likely that the output voltage of switching power supply device 28 needs to be changed beyond a controllable range of switching frequency fs. Further, when such a situation occurs, it is difficult to maintain the output voltage of secondary winding L2 at an adequate voltage only by controlling switching frequency fs.

Hence, in switching power supply device 28 according to the present exemplary embodiment, microcomputer 21 is configured to monitor a current detected by current detection circuit 23, and control the switching operation of switching element Q3 based on a monitoring result. This operation will be described in detail below.

Memory 26 stores information related to status of a circuit described below based on an instruction from microcomputer 21. In addition, FIG. 3 illustrates an example where memory 26 is arranged outside light source driver 20. However, memory 26 may be provided to switching power supply device 28 or may be provided to light source driver 20. Alternatively, memory 26 may be built in microcomputer 21.

[1-2. Operation]

The operation of switching power supply device 28 illustrated in FIG. 3 will be schematically described below.

In switching power supply device 28, when switching element Q1 first switches to the on state and then switching element Q2 switches to the off state, a current (e.g. positive direction current) output from DC power supply Vin flows to primary winding L1 of transformer T. Next, when switching element Q1 switches to the off state and switching element Q2 switches to the on state, a reverse direction current (e.g. negative direction current) opposite to the above current flows from capacitor Cr to primary winding L1 of transformer T. This phenomenon occurs when a current resonant circuit including capacitor Cr, magnetizing inductance Lm and leakage inductance Lr causes current resonance. Thus, when switching elements Q1 and Q2 alternately repeat on and off in switching power supply device 28, a positive direction current and a negative direction current alternately flow to primary winding L1 of transformer T. Further, when these operations are repeated, a voltage is induced to the secondary winding L2 side of transformer T.

The voltage induced to the secondary winding L2 side of transformer T is rectified by diodes D1, D2, D3 and D4, and is smoothed by capacitors C1 and C2. In this regard, control circuit 22 controls switching frequency fs of switching elements Q1 and Q2 to obtain a predetermined output voltage.

Generally, in a switching power supply device of LLC type, a voltage and a current respectively resonate, consequently, power loss and noise caused upon switching of on and off between the first switching element (e.g. switching element Q1) and the second switching element (e.g. switching element Q2) can be reduced. However, the switching power supply device of LLC type has a narrower output voltage control range than that of a switching power supply device of PWM controlled type. Hence, the switching power supply device of LLC type is not suitable for a power supply source to a load circuit whose load fluctuation is relatively significant.

Meanwhile, projection video display device 100 which has been described as an example in the present exemplary embodiment includes light source 10 in which first light source module 11 having a configuration where each of a plurality of semiconductor laser diodes 11a is connected in series, and second light source module 12 having a configuration where each of a plurality of semiconductor laser diodes 12a is connected in series are connected in series. Hence, when a situation that one of pluralities of semiconductor laser diodes 11a and 12a gets out of order and becomes disconnected state (such as a situation will be referred to as an "open failure) occurs, the current path of a current flowing in light source 10 is blocked, currents stop flowing even to normal semiconductor laser diodes and all semiconductor laser diodes switch to non-light emission states.

To prevent occurrence of such a situation, it is necessary to switch to an on state a switching element connected in parallel to a semiconductor laser diode in which an open failure has occurred, and secure the current path of the current flowing in light source 10. When, for example, an open failure occurs in semiconductor laser diodes 12a, it is possible to maintain light emission of normal semiconductor laser diode 11a by switching FET 12b to the on state and providing the current path which passes through FET 12b.

However, when such a situation occurs, a significant load fluctuation occurs in the load circuit which receives a supply of power from switching power supply device 28. When, for example, FET 12b switches to the on state in the above example, second light source module 12 substantially becomes a short-circuited state. Hence, the load of the load circuit seen from switching power supply device 28 is reduced to a half from a circuit connected in series with first light source module 11 and second light source module 12 to a circuit of single first light source module 11. The same applies to the opposite case. When such a significant load fluctuation occurs in the load circuit, a current flowing in the load circuit is likely to significantly fluctuate. Therefore, it is desirable to adequately lower the output voltage of switching power supply device 28 according to a load fluctuation. When, for example, FET 12b is switched to the on state due to the open failure of second light source module 12, it is possible to flow the substantially same current as a current which flows before the open failure occurs, to first light source module 11 by adequately lowering the output voltage of switching power supply device 28. However, in such a case, it is difficult to keep the output voltage of switching power supply device 28 at an adequate voltage only by controlling switching frequency fs.

Switching power supply device 28 according to the present exemplary embodiment is configured to be able to supply stable power to the load circuit even when such a significant load fluctuation occurs in the load circuit.

Operations of switching power supply device 28 both when all of semiconductor laser diodes 11a and 12a are normal (first operation) and when one of the semiconductor laser diodes 11a and 12a causes an open failure (second operation) will be described below with reference to FIGS. 4 to 7.

FIGS. 4 to 7 are views schematically illustrating an operation example of switching power supply device 28 according to the first exemplary embodiment. In addition, FIGS. 4 to 7 illustrate current flows as broken lines.

[1-2-1. First Operation]

When both of semiconductor laser diodes 11a and 12a normally operate, a load of the load circuit seen from switching power supply device 28 is relatively high. In such a case, in switching power supply device 28, microcomputer 21 switches switching element Q3 to the on state to prevent the output voltage from lowering.

Figure 4:
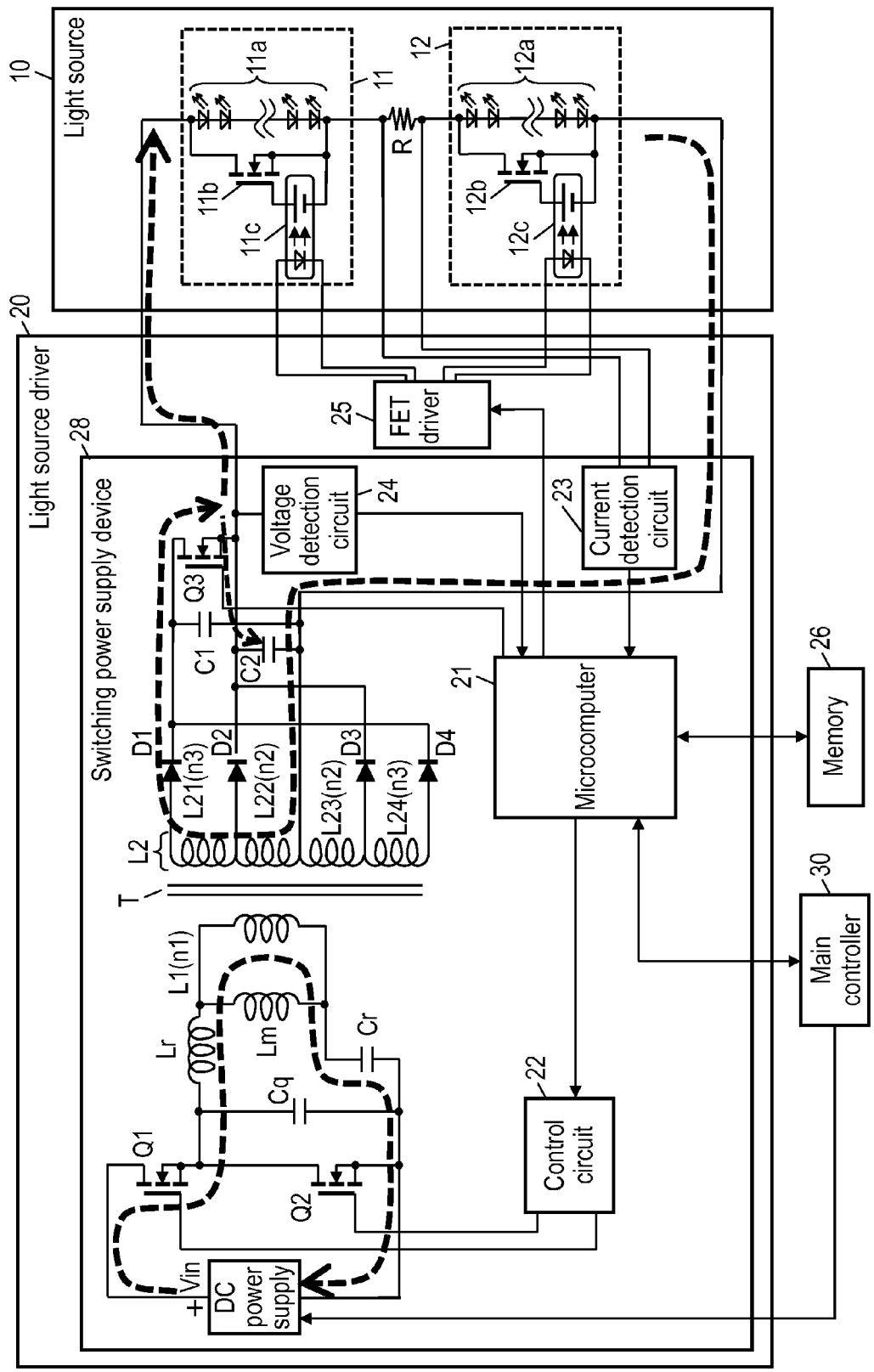
FIG. 4 is a view schematically illustrating an operation example of the switching power supply device according to the first exemplary embodiment.

Control circuit 22 switches switching element Q1 to the on state, and switches switching element Q2 to the off state. Thus, as illustrated in FIG. 4, a current flows from DC power supply Vin to primary winding L1, and a voltage is induced to winding units L22 and L21 of secondary winding L2. This induced voltage is rectified by diode D1 and is smoothed by capacitors C1 and C2.

Figure 5:
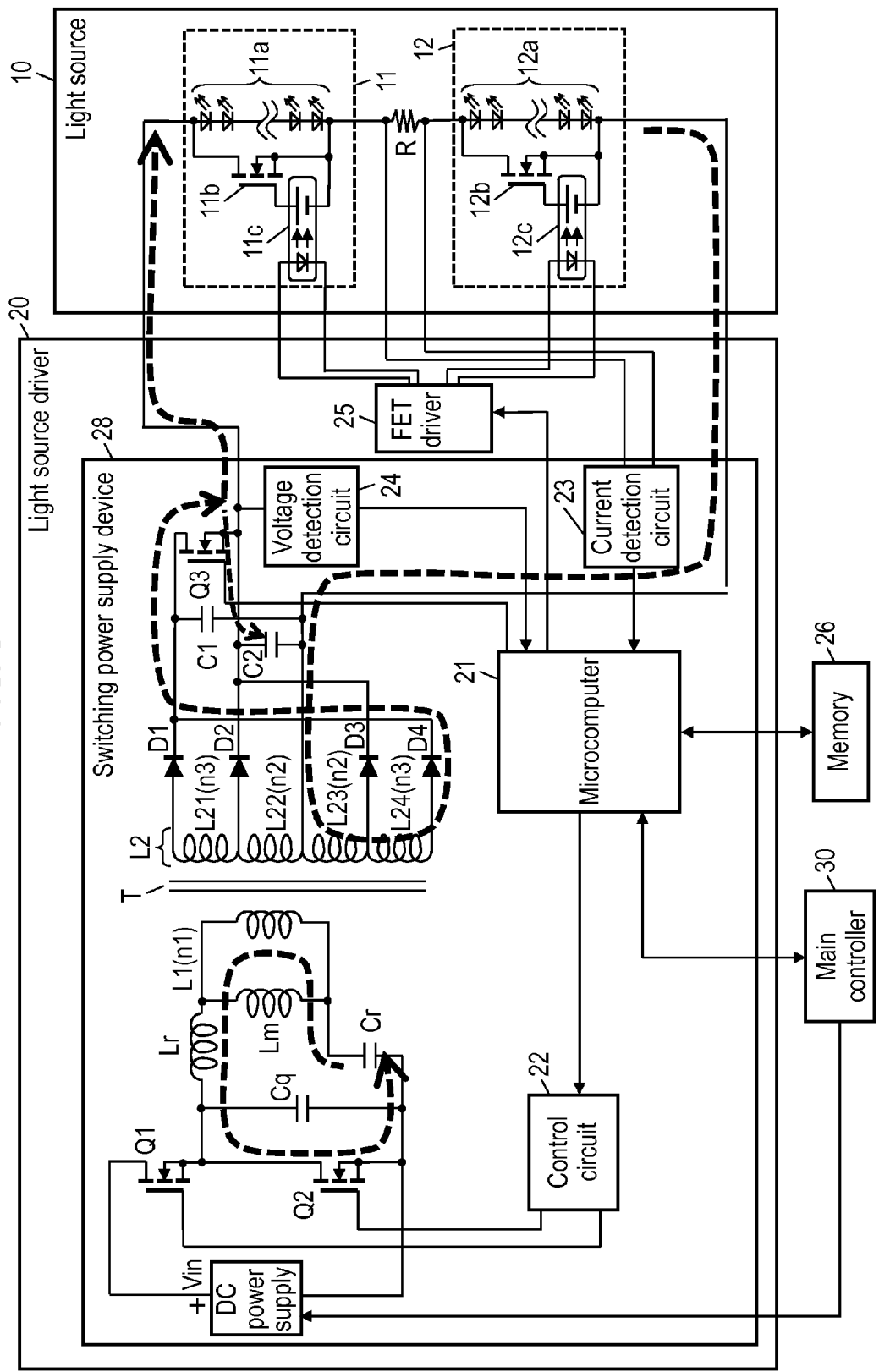
FIG. 5 is a view schematically illustrating an operation example of the switching power supply device according to the first exemplary embodiment.

Next, control circuit 22 switches switching element Q1 to the off state, and switches switching element Q2 to the on state. Thus, as illustrated in FIG. 5, a reverse direction current opposite to the above current flows from capacitor Cr to primary winding L1, and a voltage is induced to winding units L23 and L24 of secondary winding L2. This induced voltage is rectified by diode D4 and is smoothed by capacitors C1 and C2.

According to these operations, the voltages between both terminals of capacitors C1 and C2 become first output voltage V1, and power of first output voltage V1 is supplied to light source 10.

In this case, microcomputer 21 supplies information based on a voltage value (information indicating the voltage value of first output voltage V1) detected by voltage detection circuit 24, to control circuit 22. Control circuit 22 controls (feedback control) switching frequency fs of switching elements Q1 and Q2 based on the information supplied from microcomputer 21 such that first output voltage V1 does not fluctuate.

[1-2-2. Second Operation]

When one or both of semiconductor laser diodes 11a and 12a cause an open failure, a current path in which a current has flowed is disconnected and the current stops flowing to current detection resistor R. When the current stops flowing to resistor R, current detection circuit 23 detects that the current has stopped flowing to resistor R, and information indicating a detection result is supplied from current detection circuit 23 to microcomputer 21. Microcomputer 21 which has received this information determines that one of the semiconductor laser diodes causes an open failure. Further, microcomputer 21 temporarily lowers the output voltage of DC power supply Vin through, for example, main controller 30. This is to prevent an overvoltage from being applied to the load circuit (e.g. light source 10) in a process of an operation described below.

At a point of time at which the information indicating that the current has stopped flowing to resistor R is supplied from current detection circuit 23 to microcomputer 21, in which one of first light source module 11 and second light source module 12 an open failure occurs is not clear to microcomputer 21. Hence, microcomputer 21 first drives FET driver 11c of first light source module 11 through FET driver 25, and switches FET 11b to the on state. Thus, the both terminals of semiconductor laser diodes 11a connected in series are short-circuited.

When an open failure occurs in semiconductor laser diode 11a, the current then flows to resistor R. Hence, when receiving a detection result (a detection result indicating that the current has flowed to resistor R) supplied from current detection circuit 23, microcomputer 21 can determine that an open failure occurs in first light source module 11. Further, this determination result (information indicating that the open failure occurs in first light source module 11) is stored in memory 26 by microcomputer 21.

Meanwhile, when the current does not still flow to resistor R, microcomputer 21 can determine that an open failure occurs in other than first light source module 11 based on the detection result (the detection result indicating that the current does not flow to resistor R) in current detection circuit 23. In this case, microcomputer 21 returns FET 11*b* to the off state through FET driver 25.

Next, microcomputer 21 drives FET driver 12*c* of second light source module 12 through FET driver 25, and switches FET 12*b* to the on state. Thus, the both terminals of semiconductor laser diodes 12*a* connected in series are short-circuited.

When an open failure occurs in semiconductor laser diode 12*a*, the current then flows to resistor R. Hence, when receiving a detection result (a detection result indicating that the current has flowed to resistor R) supplied from current detection circuit 23, microcomputer 21 can determine that an open failure occurs in second light source module 12. Further, this determination result (information indicating that the open failure occurs in second light source module 12) is stored in memory 26 by microcomputer 21.

At a point of time at which FET 11*b* or FET 12*b* is switched to the on state and the current starts flowing to light source 10, a voltage corresponding to the number of turns (n2+n3) of secondary winding L2 is generated by secondary winding L2 of transformer T. In addition, this voltage is lower than first output voltage V1 by a decrease of output voltage of DC power supply Vin.

Next, even while keeping switching element Q3 in the on state, microcomputer 21 determines whether or not it is possible to supply power at a stable output voltage (adequate current) to the load circuit (e.g. light source 10) of a reduced load.

Microcomputer 21 stores in advance an association between a number of light source modules which have caused open failures and on/off state of switching element Q3. Although not illustrated, an example of the association in a case where, for example, light source 10 has four light source modules will be described. Microcomputer 21 may be set to determine that it is possible to supply power at a stable output voltage even while keeping switching element Q3 in the on state when, for example, the number of light source modules is 0 or 1, or determine that it is difficult to supply power at a stable output voltage if switching element Q3 is not switched to the off state (an overcurrent is likely to flow to the load circuit) when the number of light source modules which have caused open failures is two or more. In addition, an example of these numerical values and the association is only an example, and the present disclosure is not limited to the numerical values and the association.

Thus, when determining that it is possible to supply power at a stable output voltage, microcomputer 21 keeps switching element Q3 in the on state. Further, when determining that it is difficult to supply power at a stable output voltage (an overcurrent is likely to flow to the load circuit), microcomputer 21 switches switching element Q3 to the off state. Furthermore, microcomputer 21 stores information indicating that switching element Q3 has been switched to the off state, in memory 26.

Subsequently, microcomputer 21 returns the temporarily lowered output voltage of DC power supply Vin to the original voltage value.

Subsequently, microcomputer 21 and control circuit 22 control an operation of switching on and off of switching elements Q1 and Q2 as follows, and secondary winding L2 of transformer T generates an output voltage. In this case, when switching element Q3 is in the on state, the output voltage is first output voltage V1. When switching element Q3 is in the off state, the output voltage is as follows.

Figure 6:
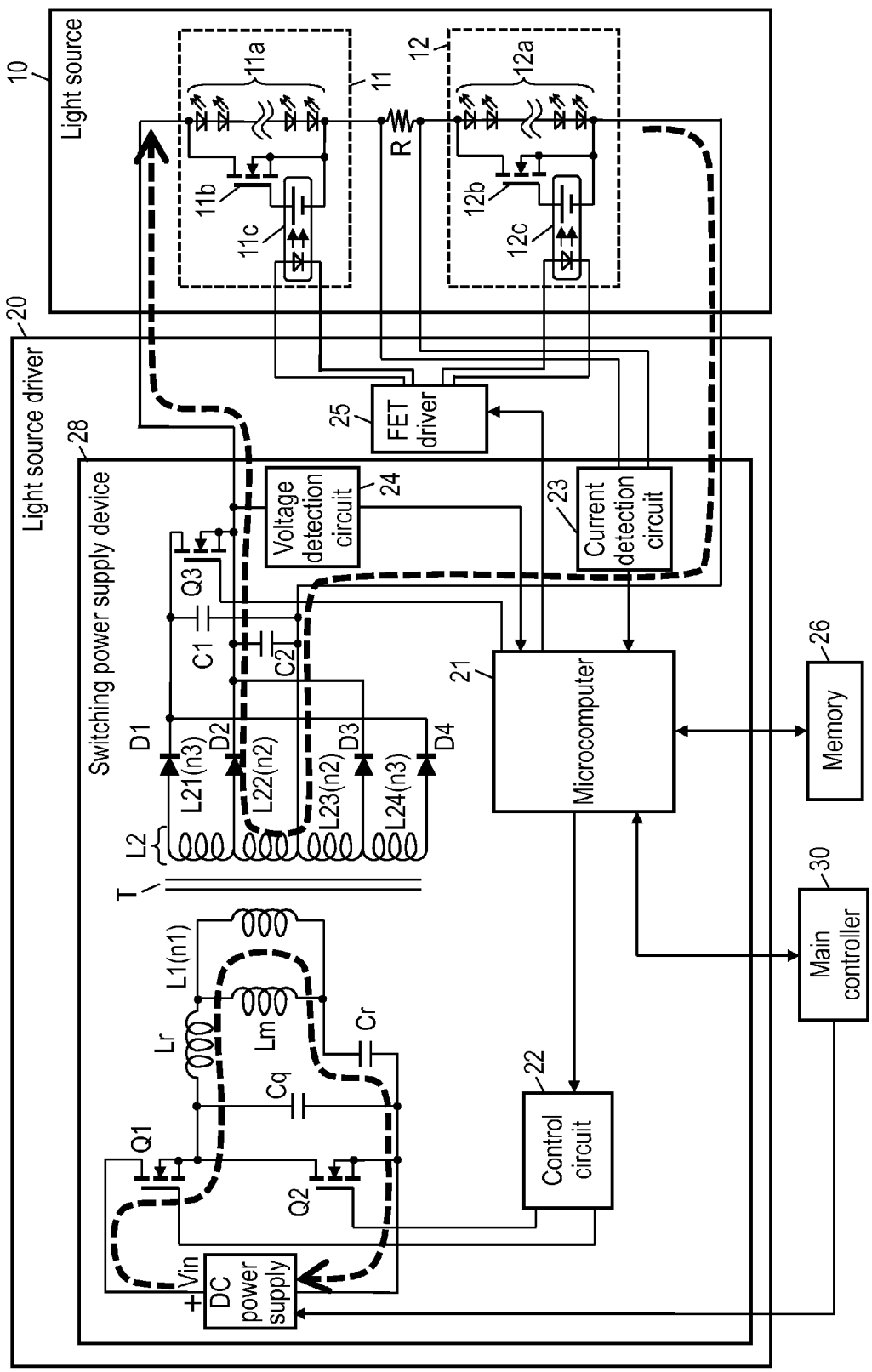
FIG. 6 is a view schematically illustrating an operation example of the switching power supply device according to the first exemplary embodiment.

Control circuit 22 switches switching element Q1 to the on state, and switches switching element Q2 to the off state. Thus, as illustrated in FIG. 6, a current flows from DC power supply Vin to primary winding L1, and a voltage is induced to winding unit L22 of secondary winding L2. This induced voltage is rectified by diode D2 and is smoothed by capacitor C2.

According to this operation, the voltage between both terminals of capacitor C2 becomes second output voltage V2, and power of second output voltage V2 is supplied to light source 10. In this case, the voltage generated by winding units (L22+L21) is rectified by diode D1 and is smoothed by capacitor C1. However, switching element Q3 is in the off state, so that power accumulated in capacitor C1 is not supplied to light source 10.

Figure 7:
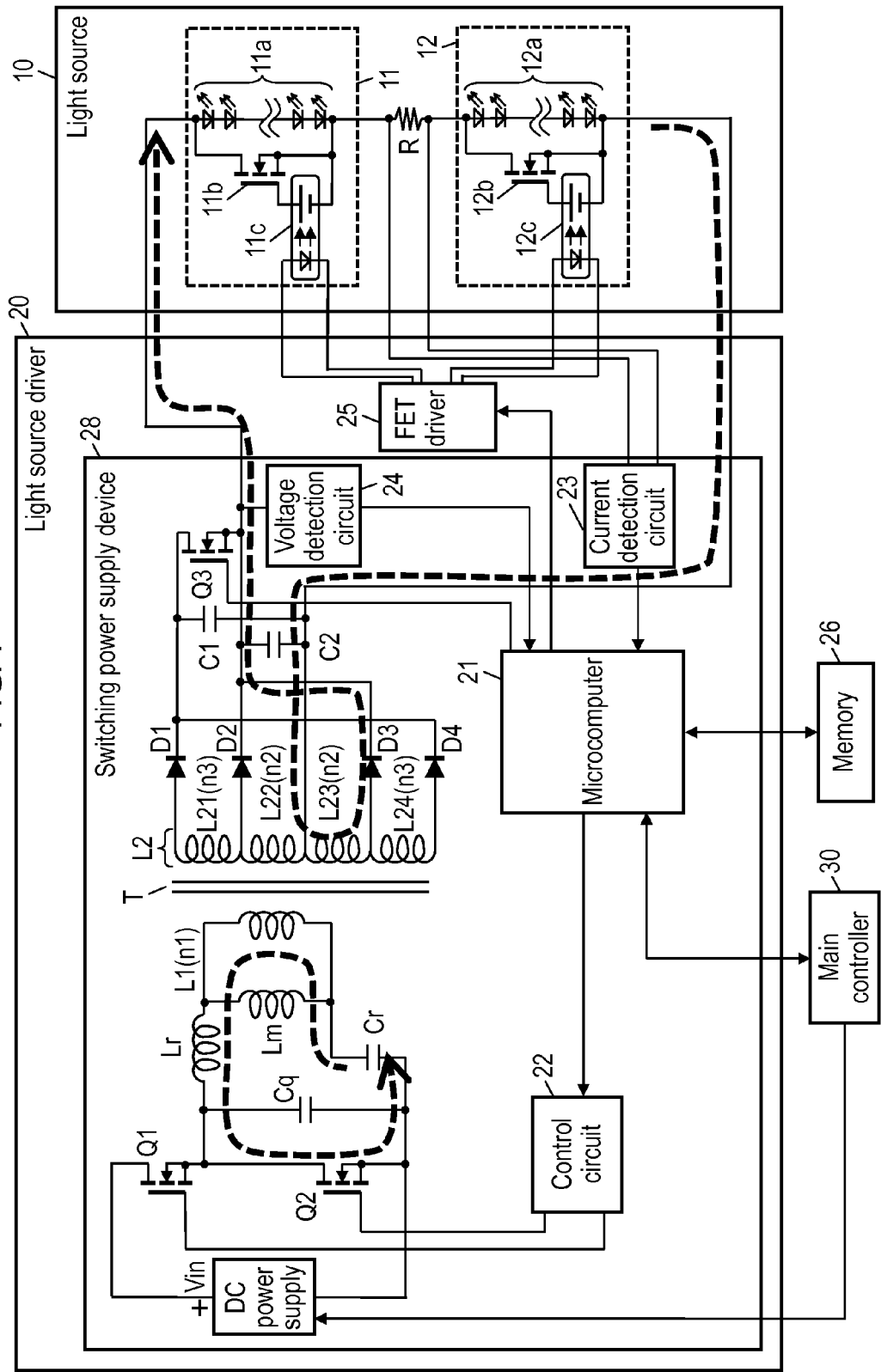
FIG. 7 is a view schematically illustrating an operation example of the switching power supply device according to the first exemplary embodiment.

Next, control circuit 22 switches switching element Q1 to the off state, and switches switching element Q2 to the on state. Thus, as illustrated in FIG. 7, a reverse direction current opposite to the above current flows from capacitor Cr to primary winding L1, and a voltage is induced to winding unit L23 of secondary winding L2. This induced voltage is rectified by diode D3 and is smoothed by capacitor C2.

According to this operation, the voltage between both terminals of capacitor C2 becomes second output voltage V2, and power of this second output voltage V2 is supplied to light source 10. In this case, the voltage generated by winding units (L23+L24) is rectified by diode D4 and is smoothed by capacitor C1. However, switching element Q3 is in the off state, so that power accumulated in capacitor C1 is not supplied to light source 10.

Thus, when switching element Q3 is in the off state, second output voltage V2 rectified by diodes D2 and D3 and smoothed by capacitor C2 among voltages induced by secondary winding L2 of transformer T is supplied to the load circuit (light source 10) from switching power supply device 28. This second output voltage V2 is a voltage corresponding to the number of turns n2 of winding units L22 and L23 of secondary winding L2, and is a lower voltage than first output voltage V1 according to a ratio of the numbers of turns of winding units L21 to L24 (a ratio of n2 and n3). For example, in case of the number of turns n2=8 and the number of turns n3=4, second output voltage V2 is a ⅔ voltage of first output voltage V1.

Thus, an operation of switching power supply device 28 after switching element Q3 is switched to the off state is substantially the same as the operation of switching power supply device 28 described with reference to the first operation except for that second output voltage V2 to be generated becomes lower than first output voltage V1. That is, microcomputer 21 supplies information based on a voltage value detected by voltage detection circuit 24 (information indicating the voltage value of second output voltage V2) to control circuit 22. Control circuit 22 controls (feedback control) switching frequency fs of switching elements Q1 and Q2 such that second output voltage V2 does not fluctuate, based on the information supplied from microcomputer 21.

In addition, in the operation example described in the first exemplary embodiment, first output voltage V1 is set to such a voltage that an adequate current flows to normally operating first light source module 11 and second light source module 12, and second output voltage V2 is set to such a voltage that an adequate current flows to single first light source module 11 or single second light source module 12. However, the present disclosure is by no means limited to this configuration. First output voltage V1 and second output voltage V2 are desirably set adequately according to the configuration of light source 10. Further, according to the configuration of light source 10, switching power supply device 28 may be configured to output third output voltage V3 and fourth output voltage V4.

In addition, when projection video display device 100 is activated, microcomputer 21 reads information stored in memory 26, and makes various settings based on this read information. For example, in case of the above example, in memory 26, failure information related to light source 10 (e.g. information indicating that an open failure has occurred in second light source module 12) and information related to a voltage of power output from switching power supply device 28 (e.g. information indicating that an off state is set to switching element Q3 and second output voltage V2 is selected) is stored by microcomputer 21. In this case, after these pieces of information are stored in memory 26, microcomputer 21 operates as follows every time projection video display device 100 is activated. That is, FET driver 12C of second light source module 12 is driven through FET driver 25 to switch FET 12b to the on state and short-circuit the both terminals of semiconductor laser diodes 12a connected in series. Further, switching element Q3 is switched to the off state. Furthermore, after these settings are made, switching power supply device 28 is activated.

[1-3. Effect and Others]

As described above, in the present exemplary embodiment, the switching power supply device includes: a transformer which includes a primary winding and a secondary winding divided into a plurality of winding units; a resonant capacitor which forms a resonant circuit including the primary winding as a component; a first switching element and a second switching element which are provided at a side of the primary winding; a plurality of rectifier diodes which extracts voltages induced to the secondary winding in the winding units; an output voltage switching circuit which switches the voltages extracted from the plurality of rectifier diodes and outputs a switched voltage; a current detection circuit which detects a current flowing in a load circuit; and a controller which controls the output voltage switching circuit based on a detection result of the current detection circuit.

The switching power supply device may further include a voltage detection circuit which is configured to detect the voltage supplied to the load circuit. Further, the controller may control the first switching element and the second switching element based on the detection result of the voltage detection circuit.

In this switching power supply device, the controller may temporarily lower a voltage supplied to the primary winding based on the detection result of the current detection circuit.

The projection video display device according to the present disclosure includes a light source, and a switching power supply device which supplies power to the light source. This switching power supply device includes: a transformer which includes a primary winding and a secondary winding divided into a plurality of winding units; a resonant capacitor which forms a resonant circuit including the primary winding as a component; a first switching element and a second switching element which are provided at a side of the primary winding; a plurality of rectifier diodes which extracts voltages induced to the secondary winding in the winding units; an output voltage switching circuit which switches the voltages extracted from the plurality of rectifier diodes and outputs a switched voltage; a current detection circuit which detects a current flowing in the light source; and a controller which controls the output voltage switching circuit based on a detection result of the current detection circuit.

This light source may include a plurality of light source modules which includes a plurality of semiconductor light source elements electrically connected in series. Each of the plurality of light source modules may be electrically connected in series sandwiching a current detection resistor. The current detection circuit may detect a current flowing in this resistor.

Further, each of the light source modules may include a short-circuiting switching element which is configured to short-circuit between both terminals of the plurality of semiconductor light source elements connected in series. Furthermore, the controller may control each of the short-circuiting switching elements based on the detection result of the current detection circuit.

In addition, in the present exemplary embodiment, primary winding L1 is an example of a primary winding, and secondary winding L2 is an example of secondary winding. Transformer T is an example of a transformer.

Capacitor Cr is an example of a resonant capacitor, and a current resonant circuit formed by magnetizing inductance Lm, leakage inductance Lr and capacitor Cr is an example of a resonant circuit. Switching element Q1 is an example of the first switching element, and switching element Q2 is an example of the second switching element. Switching power supply device 28 is an example of the switching power supply device. Winding units L21, L22, L23 and L24 are examples of a plurality of winding units. Diodes D1, D2, D3 and D4 are examples of rectifier diodes. Switching element Q3 is an example of an output voltage switching circuit. Current detection circuit 23 is an example of a current detection circuit. Microcomputer 21, control circuit 22 and main controller 30 are examples of the controllers. Voltage detection circuit 24 is an example of a voltage detection circuit. Light source 10 is an example of the light source, and an example of the load circuit. Projection video display device 100 is an example of a projection video display device. Semiconductor laser diodes 11a and 11b are examples of the semiconductor light source elements. First light source module 11 and second light source module 12 are examples of light source modules. Resistor R is an example of a current detection resistor. FET 11b and FET 12b are examples of short-circuiting switching elements.

Generally, the switching power supply device of LLC type has a narrower output voltage control range than that of a switching power supply device of PWM controlled type. Hence, the switching power supply device of LLC type is not suitable for a power supply source to a load circuit whose load fluctuation is relatively significant. When, for example, a load circuit is configured to short-circuit a failure portion in a case where a failure occurs, a load of the load circuit is likely to relatively significantly fluctuate. Hence, the switching power supply device of LLC type is not suitable for a power supply source to such a load circuit.

When, for example, an open failure occurs in the light source module provided to the light source which is an example of the load circuit, projection video display device 100 according to the present exemplary embodiment specifies a failure portion based on a detection result of the current detection circuit, and controls a short-circuiting switching element to short-circuit the failure portion. Hence, it is possible to secure the current path which avoids an open failure portion and maintain light emission of the normal light source module. However, the load of the load circuit is likely to relatively significantly fluctuate.

However, as described as an example in the first exemplary embodiment, the switching power supply device according to the present disclosure is configured to, when one or a plurality of light source modules provided to the light source causes open failures and is short-circuited, and therefore a relatively significant load fluctuation occurs in the load circuit, switch switching element Q3 which is an example of the output voltage switching circuit from the on state to the off state, and change the output voltage. Thus, it is possible to set the voltage output from the secondary winding of transformer T to second output voltage V2 lower than first output voltage V1 which is an output voltage in a case where switching element Q3 is in the on state. Consequently, the switching power supply device according to the present disclosure is the switching power supply device of LLC type yet can control power at a predetermined output voltage and stably supply power even when a significant load fluctuation occurs in the load circuit.

Other Exemplary Embodiments

The first exemplary embodiment has been described above as an exemplary technique disclosed in this application. However, the technique according to the present disclosure is not limited to this, and is also applicable to exemplary embodiments for which changes, replacements, additions and omissions are made. Further, components described in the first exemplary embodiment can be combined to provide new exemplary embodiments.

Hence, another exemplary embodiment will be described below.

In the first exemplary embodiment, light source 10 has a configuration including two light source modules of first light source module 11 and second light source module 12. However, the present disclosure is by no means limited to this configuration. The light source desirably includes an adequate number of light source modules to generate a light amount required by the projection video display device. For example, the light source may include three or more light source modules. In addition, when the light source includes three or more light source modules, one current detection resistor R needs to be provided. An arrangement position of resistor R and a current detection circuit in this case are desirably set appropriately.

An example where secondary winding L2 of transformer T is divided into four winding units L21, L22, L23 and L24 has been described in the first exemplary embodiment. However, the present disclosure is by no means limited to this configuration. Secondary winding L2 of transformer T desirably includes an adequate number of winding units according to the number of light source modules provided to the light source. For example, secondary winding L2 of transformer T may be divided into six or more winding units. Further, when secondary winding L2 is divided into six or more winding units, a voltage rectifying diode and a voltage smoothing capacitor are desirably added according to the number of winding units. Further, the output voltage switching circuit is desirably configured adequately according to the number of voltage output terminals.

Although not described in the first exemplary embodiment, as long as a current does not flow to resistor R when FET 11b is in the on state and FET 12b is in the off state, and the current does not flow to resistor R even when FET 11b is in the off state and FET 12b is in the on state, microcomputer 21 can determine that open failures occur in both of first light source module 11 and second light source module 12. In this case, microcomputer 21 may cause a display unit (not illustrated) to display an error message indicating that the open failures occur in first light source module 11 and second light source module 12. Further, this error message may be replaced with lighting or flickering of LEDs provided to the projection video display device.

In the first exemplary embodiment, when an open failure occurs in one of semiconductor laser diodes, an output voltage of DC power supply Vin is temporarily lowered. However, the present disclosure is by no means limited to this operation. For example, microcomputer 21 may switch switching element Q3 from on to off at a point of time at which an open failure is confirmed. Even this operation can prevent an overcurrent from flowing to the load circuit.

A configuration example where microcomputer 21, control circuit 22 and main controller 30 are separately provided has been described in the first exemplary embodiment. However, a plurality or all of these microcomputer 21, control circuit 22 and main controller 30 may be integrated as one controller. Alternatively, an output of voltage detection circuit 24 may be configured to be directly input to control circuit 22. Alternatively, microcomputer 21 may be configured to directly control an output voltage of DC power supply Vin.

The present disclosure is applicable to a switching power supply device of LLC type and a projection video display device which has this switching power supply device.

What is claimed is:
1. A projection video display device comprising:
a light source; and
a switching power supply device which supplies power to the light source,
wherein the switching power supply device includes
a transformer which includes a primary winding and a secondary winding divided into a plurality of winding units;
a resonant capacitor which forms a resonant circuit including the primary winding as a component;
a first switching element and a second switching element which are provided at a side of the primary winding;
a plurality of rectifier diodes electrically connected to respective ones of the winding units of the secondary winding, the rectifier diodes extracting voltages induced to the secondary winding in the winding units;
an output voltage switching circuit which switches the respective voltages extracted from the rectifier diodes and outputs a plurality of mutually different switched voltages;
a current detection circuit which detects a current flowing in the light source; and
a controller which controls the output voltage switching circuit based on a detection result of the current detection circuit,
wherein the light source includes a plurality of light source modules which includes a plurality of semiconductor light source elements electrically connected in series,
wherein each of the plurality of light source modules is electrically connected in series sandwiching a current detection resistor,
wherein the current detection circuit detects currents flowing in the resistor,
wherein each of the light source modules includes a short-circuiting switching element which is configured to short-circuit between both terminals of the plurality of semiconductor light source elements connected in series, and wherein the controller is configured to control each of the short-circuiting switching elements based on the detection result of the current detection circuit.

2. The projection video display device according to claim 1, wherein the controller temporarily lowers a voltage supplied to the primary winding based on the detection result of the current detection circuit.

3. A projection video display device comprising:
a light source; and
a switching power supply device which supplies power to the light source,
wherein the switching power supply device includes
a transformer which includes a primary winding and a secondary winding divided into a plurality of winding units;
a resonant capacitor which forms a resonant circuit including the primary winding as a component;
a first switching element and a second switching element which are provided at a side of the primary winding;
a plurality of rectifier diodes which extract voltages induced to the secondary winding in the winding units;
an output voltage switching circuit which switches the voltages extracted from the plurality of rectifier diodes and outputs a switched voltage;
a current detection circuit which detects a current flowing in the light source; and
a controller which controls the output voltage switching circuit based on a detection result of the current detection circuit,
wherein the light source includes a plurality of light source modules which includes a plurality of semiconductor light source elements electrically connected in series,
wherein each of the plurality of light source modules is electrically connected in series sandwiching a current detection resistor, and the current detection circuit detects currents flowing in the resistor, and
wherein each of the light source modules includes a short-circuiting switching element which is configured to short-circuit between both terminals of the plurality of semiconductor light source elements connected in series, and the controller is configured to control each of the short-circuiting switching elements based on the detection result of the current detection circuit.

* * * * *